(12) United States Patent
Singh

(10) Patent No.: US 6,599,145 B2
(45) Date of Patent: Jul. 29, 2003

(54) TWIST LOCK CONNECTOR SYSTEM

(75) Inventor: Harvinder Singh, Shelby Township, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 25 days.

(21) Appl. No.: 09/909,116

(22) Filed: Jul. 19, 2001

(65) Prior Publication Data

US 2003/0017735 A1 Jan. 23, 2003

(51) Int. Cl.7 .................................................. H01R 4/26
(52) U.S. Cl. ........................ 439/329; 439/439; 439/332
(58) Field of Search .............................. 439/329, 262, 439/637, 67, 260, 581, 582, 289, 332, 333

(56) References Cited

U.S. PATENT DOCUMENTS

| | | | |
|---|---|---|---|
| 3,950,060 A | * | 4/1976 | Stipanuk et al. ............ 439/329 |
| 4,373,771 A | * | 2/1983 | Cross et al. ................ 439/332 |
| 4,474,420 A | | 10/1984 | Nestor |
| 4,533,188 A | | 8/1985 | Miniet |
| 4,955,814 A | | 9/1990 | Christie et al. |
| 4,969,840 A | | 11/1990 | Ii et al. |
| 5,454,734 A | | 10/1995 | Eggert et al. |
| 5,833,474 A | | 11/1998 | Kidd |
| 6,095,856 A | * | 8/2000 | Horan et al. ................ 439/567 |
| 6,220,881 B1 | * | 4/2001 | Murakami et al. .......... 439/262 |

* cited by examiner

Primary Examiner—Jean F. Duverne
(74) Attorney, Agent, or Firm—Brinks Hofer Gilson & Lione

(57) ABSTRACT

A connector for electrically connecting electrical wires to a circuit board having a hole includes at least one terminal adapted to individually connect the circuit board and the electrical wire, the terminal including a first end adapted to engage the electrical wire and a second end, opposite the first end, adapted to engage the circuit board; a housing defining at least one slot adapted to support the terminal in a particular position, and at least one retaining surface; and a retainer having at least one hook adapted to extend through the hole in the circuit board and engage the retaining surface of the housing.

12 Claims, 4 Drawing Sheets

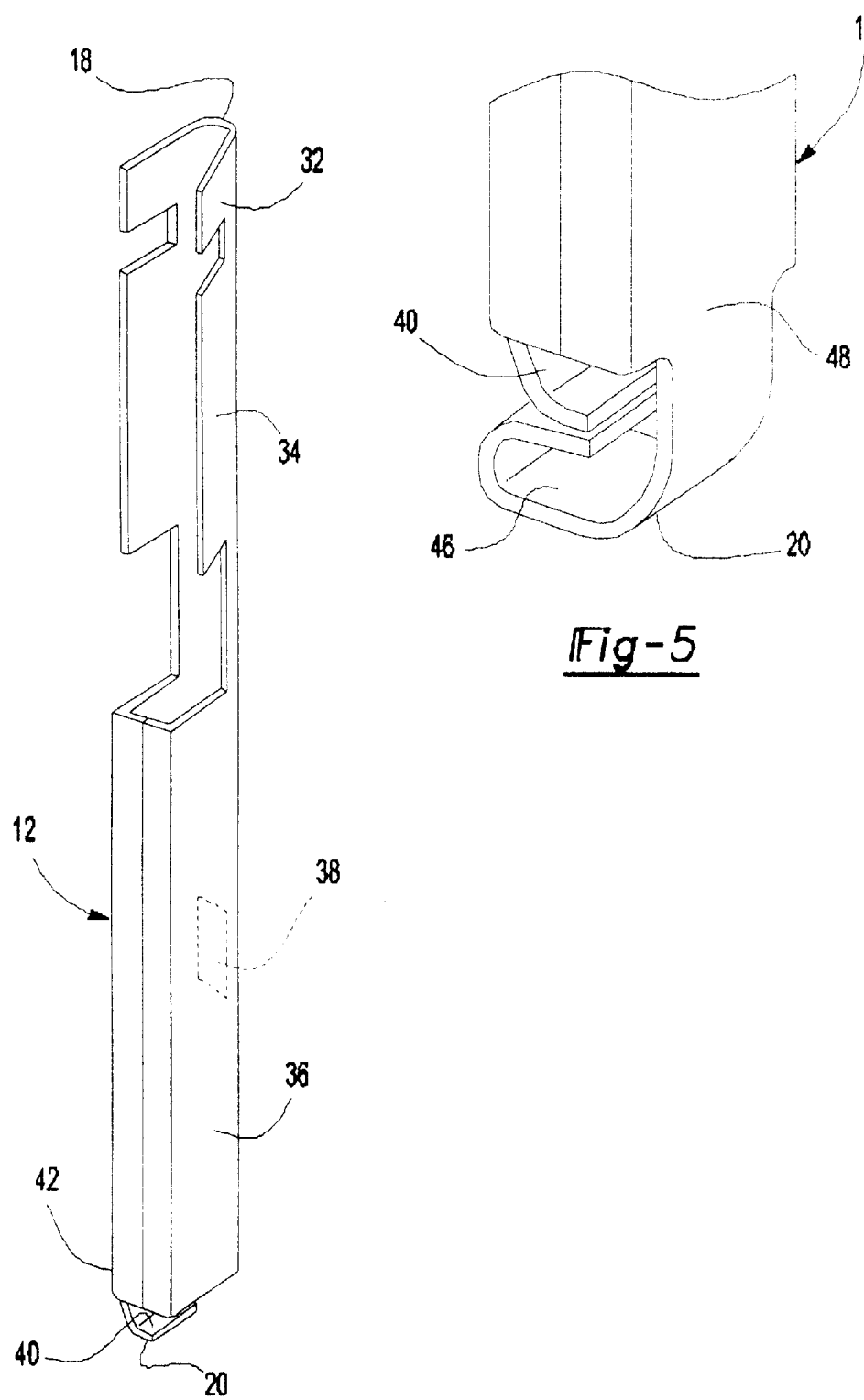

TWIST LOCK CONNECTOR SYSTEM

TECHNICAL FIELD OF THE INVENTION

The present invention generally relates to a terminal for connecting a round wire to a flat circuit board, and a method of making the terminal.

BACKGROUND

The use of flexible circuit boards in the automotive industry is common and many methods of connecting wiring to these flexible circuit boards exist. However, difficulties arise in trying to reliably and easily connect round wires to flexible circuit boards and the like. Therefore, there is a need in the industry for an improved device to connect round electrical wires to a flat, flexible circuit board.

SUMMARY OF THE INVENTION

In accordance with an aspect of the present invention, a connector for electrically connecting electrical wires to a circuit board having a hole includes at least one terminal adapted to individually connect the circuit board and the electrical wire. The terminal includes a first end adapted to engage the electrical wire and a second end, opposite the first end, adapted to engage the circuit board. The connector further includes a housing defining at least one slot adapted to support the terminal in a particular position, and at least one retaining surface and includes a retainer having at least one hook adapted to extend through the hole in the circuit board and engage the retaining surface of the housing.

BRIEF DESCRIPTION OF THE DRAWINGS

FIG. 4 is a perspective view of a terminal of the present invention;

FIG. 5 is a close up view of the end of the terminal shown in FIG. 4; and

DETAILED DESCRIPTION OF THE PREFERRED EMBODIMENT

Figure 1:
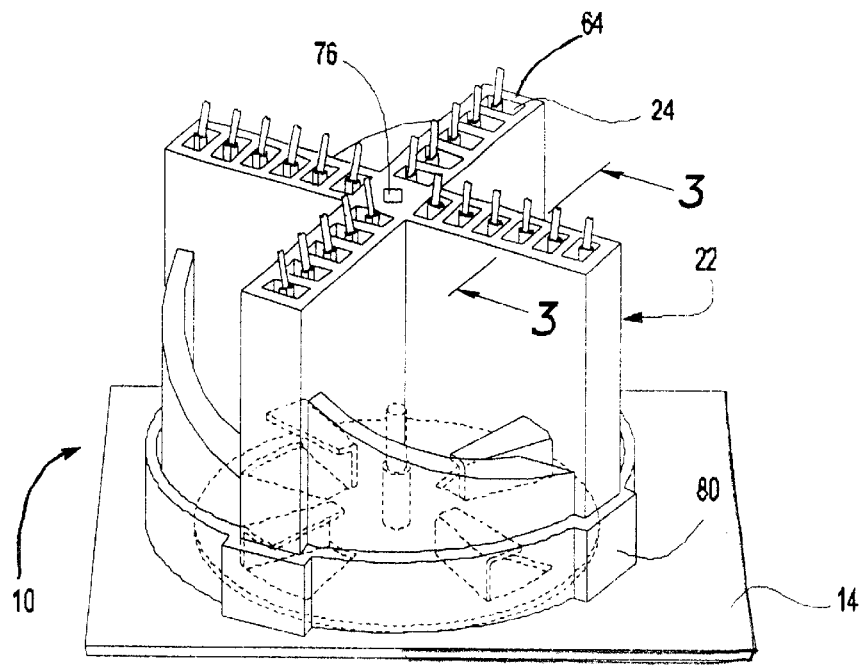
FIG. 1 is a perspective view of a connector of the present invention.

The following description of the preferred embodiment of the invention is not intended to limit the scope of the invention to this preferred embodiment, but rather to enable any person skilled in the art to make and use the invention.

A connector for electrically connecting electrical wires to a circuit board having a hole is generally shown at 10. The connector 10 includes at least one terminal 12 adapted to individually connect a circuit board 14 and an electrical wire 16. Referring to FIG. 4, the terminal 12 includes a first end 18 adapted to engage the electrical wire 16 and a second end 20, opposite the first end 18, adapted to engage the circuit board 14.

Figure 3:
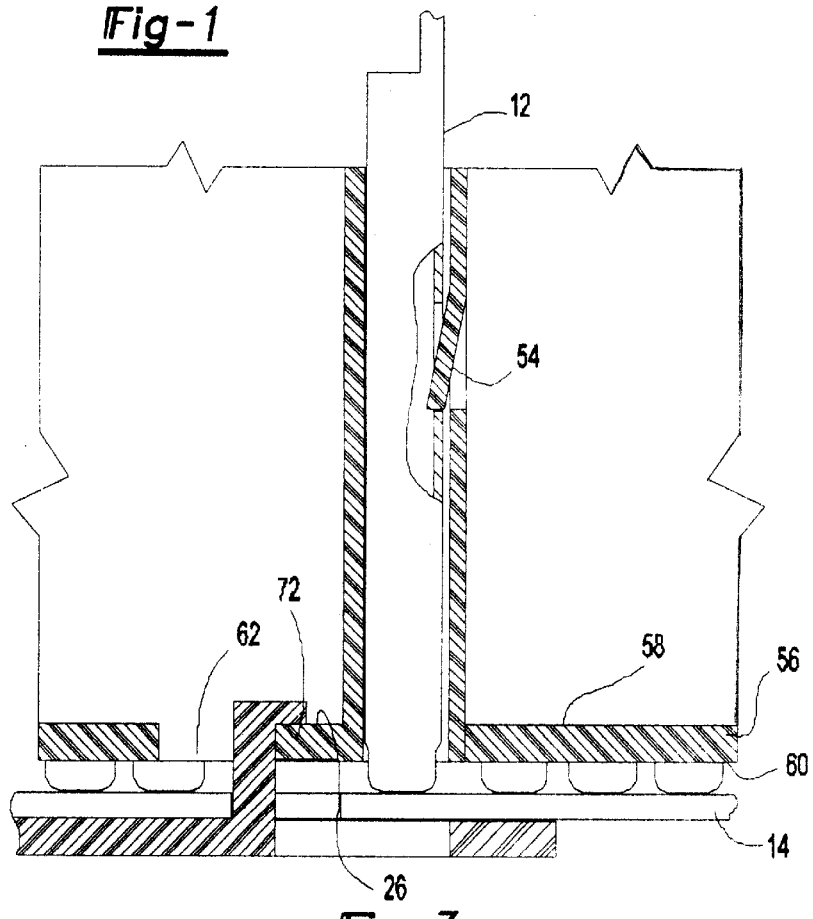
FIG. 3 is a side sectional view of the connector.
Figure 2:
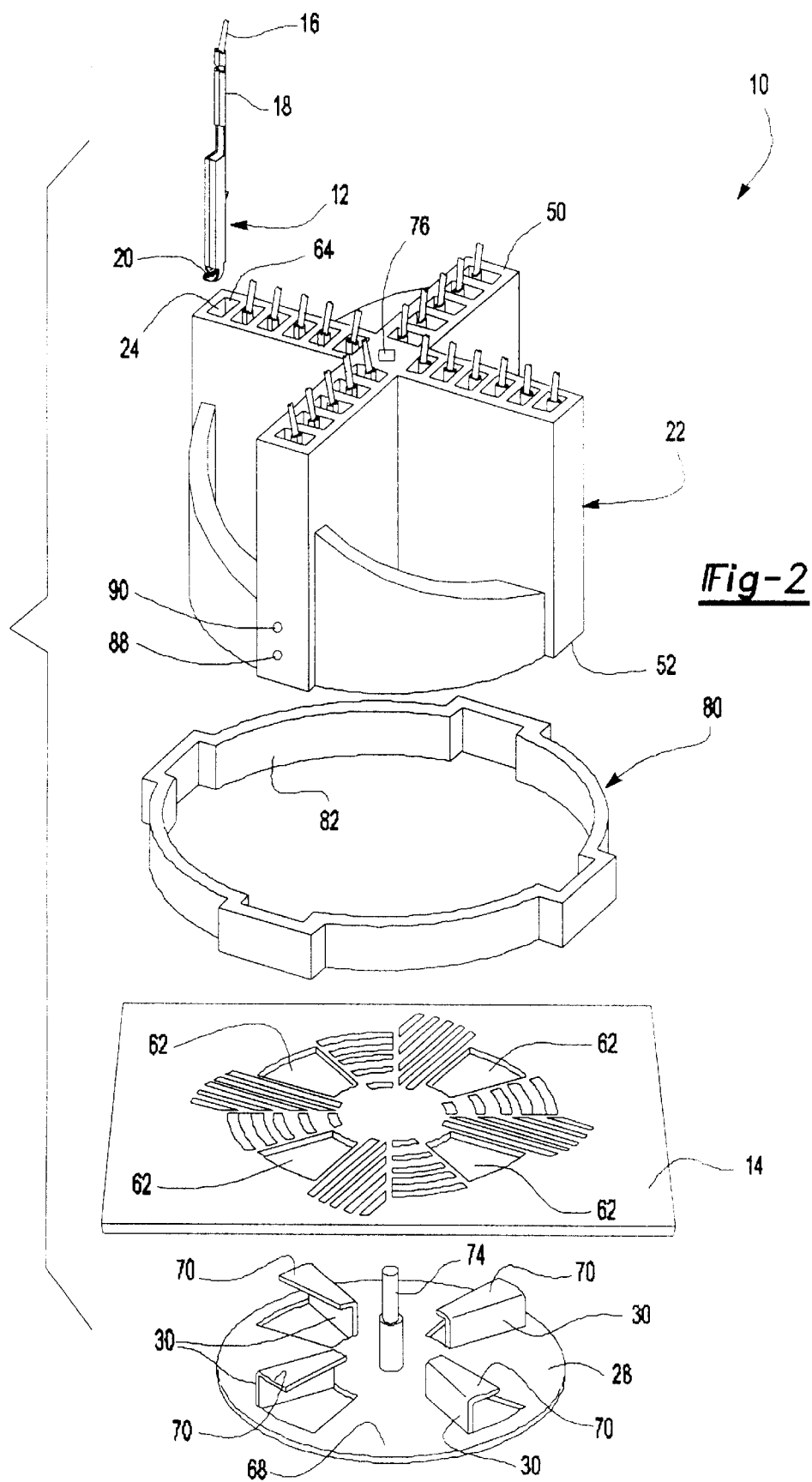
FIG. 2 is an exploded view of the connector of the present invention.
Figure 6:
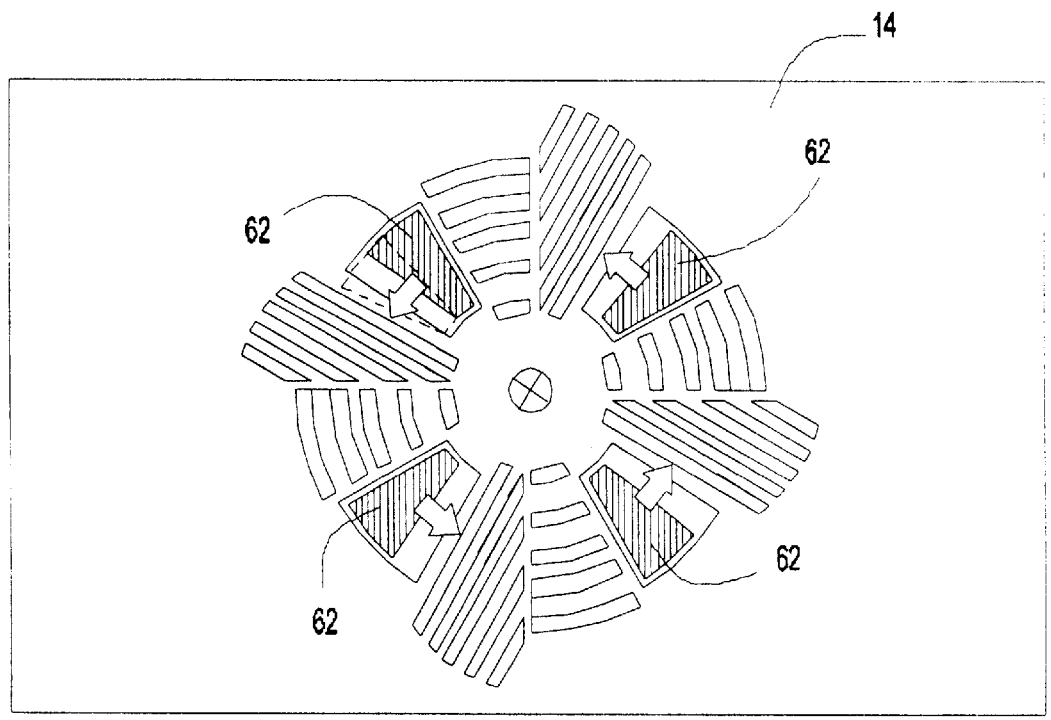
FIG. 6 is a top view of a circuit board showing how the connector engages thereto.

Referring to FIGS. 1 through 3, the connector 10 includes a housing 22 defining at least one slot 24 adapted to support the terminal 12 in a particular position, and at least one retaining surface 26. The connector 10 further includes a retainer 28 having at least one hook 30 adapted to extend through the hole in the circuit board 14 and engage the retaining surface 26 of the housing 22.

Referring again to FIG. 4, the terminal 12 includes a first pair of opposing flaps 32 located adjacent the first end 18. The first pair of opposing flaps 32 are adapted to engage the electrical wire 16 to secure the electrical wire 16 to the terminal 12. The terminal also includes a second pair of opposing flaps 34 located at a distance from the first pair of opposing flaps 32. The second pair of opposing flaps 34 are adapted to engage the electrical wire 16 to conduct electric current between the electric wire 16 and the terminal 12.

The electric wire 16 is a typical wire comprising a conductive metallic core surrounded by a non-conductive outer coating, which is typically plastic. When the electric wire 16 is attached to the terminal 12, a portion of the plastic outer coating at the end of the electric wire 16 is stripped from the electric wire 16 exposing the metallic core. The electric wire 16 is placed to the terminal 12 so that the exposed metallic core is adjacent the second pair of opposing flaps 34, and the first pair of opposing flaps 32 is adjacent a portion of the electric wire 16 which is still covered by the plastic coating. The first pair of opposing flaps are folded over onto the electric wire 16 and engage the plastic coating to pinch the electric wire 16 and hold the electric wire 16 to the terminal 12. The second pair of opposing flaps 34 are folded over onto the exposed metallic core to provide a conductive path from the electric wire 16 to the terminal. The terminal 12 is preferably made form a ductile conductive metal such as copper, however it is to be understood that any conductive metal could be suitable.

The terminal further includes a square tubular section 36 disposed between the second pair of opposing flaps 34 and the second end 20 of the terminal 12. A notch 38 is formed within the square tubular section 36, and a first curved flexible finger 40 extends from the second end 20 of the terminal 12 on a first side 42 of the square tubular section 36. A dimple extends from the first flexible finger 40 to provide a contact surface between the first flexible finger 40 and the circuit board 14.

Referring to FIG. 5, the terminal 12 can also include a second curved flexible finger 46 extending from the second end 20 of the terminal 12, on a second side 48 of the square tubular section 36 opposite the first side 42 of the square tubular section 36. The second flexible finger 46 is folded over onto the first flexible finger 40 to provide higher contact force. A terminal 12 with only a first flexible finger 40, or a "single spring" terminal, has a contact force on the order of approximately 200 to approximately 300 grams, whereas a terminal 12 with a second flexible finger 46 folded over onto the first flexible finger 40, or a "double spring" terminal 12, has a contact force on the order of approximately 400 to approximately 700 grams. The contact force is the force the finger exerts against the circuit board 14 when the terminal 12 is held in contact with the circuit board 14. If a terminal includes a second flexible finger 46, then the second flexible finger 46 includes a dimple rather than the first flexible finger 40.

Referring again to FIGS. 1 through 3, the housing 22 includes a first end 50 and a second end 52. The slot 24 extend between the first end 50 and the second end 52 and including a flexible extension 54 disposed therein to engage the notch 38 on the terminal 12 to secure the terminal 12 within the slot 24. In the preferred embodiment the housing 22 includes a plurality of slots 24 to allow the housing 22 to support a number of terminals 12 to make a corresponding number of electrical connections.

The second end 52 of the housing 22 includes a base 56. The base includes a top surface 58, a bottom surface 60, and at least one aperture 62 extending through the base 56. Each slot 24 includes a top opening 64 at the first end 50 of the housing 22. The top opening 64 of the slot 24 is adapted to receive the terminal 12. Each slot 24 also includes a bottom opening 66 at the second end 52 of the housing 22. The bottom opening 66 of the slots 24 extends through the base 56. The overall height of the housing 22 and the corresponding length of the slots 24 is such that when the terminal 12 is inserted into the slot 24 and when the flexible extension 54 snaps into place within the notch 38 on the terminal 12 to lock the terminal 12 within the slot 24, the flexible fingers 40, 46 of the terminal will extend below the bottom 60 of the base 56.

The retainer 28 includes a top surface 68 and the hook 30 extends from this top surface 68. The hook 30 includes an extending lip 70 with a bottom surface 72 adapted for frictional engagement with the retaining surface 26 of the housing 22. The aperture 62 within the base 56 is adapted to receive the hook 30. The retaining surface 26 is that portion of the top surface 58 of the base 56 immediately adjacent to the aperture 62. The retainer 28 further includes a central spindle 74 extending from the top surface 68 of the retainer 28.

The housing includes a central bore 76 extending upward from the second end 52 of the housing 22. The central bore 76 of the housing 22 is adapted to receive the central spindle 74 of the retainer 28 to provide a pilot for inserting the retainer 28 to the housing 22. The retainer 28 is rotatable relative to the housing 22 about an axis 78 defined by the central spindle 74, thereby allowing the extending lip 70 of the retainer 28 to engage the retaining surface 26 of the housing 22 through relative rotational movement.

The connector further includes a retractable ring 80 mounted to the housing 22 to protect the flexible fingers 40, 46 which extend below the bottom 60 of the base 56 of the housing 22 when the housing 22 is not mounted to a circuit board 14. The retractable ring 80 extends radially around the housing 22 and extends below the bottom 60 of the base 56. The retractable ring 80 extends further beyond the bottom 60 of the base 56 than the flexible fingers 40, 46 such that if the housing 22 is dropped or placed onto a surface, the flexible fingers 40, 46 will not come into contact with that surface.

The retractable ring 80 is adapted to retract upward to expose the flexible fingers 40, 46 when the housing 22 is mounted to the retainer 28 with a circuit board 14 therebetween. The retractable ring 80 includes an inner surface 82 which includes a dimple extending into the inner surface 82. The housing 22 includes an outer surface 86 with a first protrusion 88 extending outward from the outer surface 86 of the housing 22. The first protrusion 88 is adapted to fit within the dimple of the retractable ring 80 to secure the retractable ring 80 in a first position on the housing 22. When in the first position, the retractable ring 80 extends below the bottom 60 of the base 56 to protect the flexible fingers 40, 46 of the terminals 12. The outer surface 86 of the housing 22 further includes a second protrusion 90 extending outward from the outer surface 86 of the housing 22 at a distance from the first protrusion 88. The second protrusion 90 is adapted to fit within the dimple of the retractable ring 80 to secure the retractable ring 80 in a second position on said housing. When the retractable ring 80 is in the second position, the retractable ring is retracted flush with the bottom 60 of the base 56 of the housing 22, thereby exposing the flexible fingers 40, 46 of the terminals 12.

In practice, a method of connecting an electric wire 16 to a circuit board 14 includes the steps of providing a terminal 12 for connecting the electric wire 16 to the circuit board 14, providing a housing 22 for supporting the terminal 12, and a retainer 28 with at least one hook 30 for securing the housing 22 to the circuit board 14. First, the electrical wire 16 is attached to the terminal 12, then the terminal 12 is inserted within the housing 22, and finally, the retainer 28 is secured to the housing 22 with the circuit board 14 therebetween.

The electric wire 16 is attached to the terminal 12 by folding the first pair of opposing flaps 32 inward to pinch the plastic coating of the electric wire 16 and securing the electric wire 16 to the terminal 12 and then folding the second pair of opposing flaps 34 inward to pinch the exposed metallic core of the electric wire 16 to electrically connect the electric wire 16 to the terminal 12.

Once the electrical wire 16 is connected to the terminal 12, the terminal 12 is inserted within the slot 24 within the housing 22 until the flexible extension 54 disposed within the slot 24 engages the notch 38 on the terminal 12, thereby securing the terminal 12 within the slot 24. In the preferred embodiment, the housing 22 includes a plurality of slots 24, each of which can secure a terminal 12 within so that the housing 22 can hold a plurality of individual electric wires 16 thereby making a corresponding plurality of electrical connections on the circuit board 14.

After the electric wires 16 are connected to the terminals 12, and the terminals 12 are secured within the housing 22, the hook 30 of the retainer 28 is inserted within holes in the circuit board 14 and then through the aperture 62 within the base 56 of the housing 22, thereby capturing the circuit board 14 between the bottom 60 of the base 56 of the housing 22 and the top surface 68 of the retainer 28 and bringing the circuit board 14 into contact with the flexible fingers 40, 46 of the terminals 12. In the preferred embodiment the retainer 28 includes four hooks 30 extending upward from the top surface 68 of the retainer 28 and the housing 22 includes four corresponding apertures 62 adapted for receiving the hooks 30. It is to be understood, that different configurations could be used with less than four or more than four hooks 30 to secure the retainer 28 to the housing 22, and that the housing 22 and the circuit board 14 to which the connector 10 is to be attached would have to be adapted accordingly.

Just prior to inserting the hooks 30 into the apertures 62, the central spindle 74 of the retainer 28 is inserted within the central bore 76 of the housing 22. The central spindle 74 will provide a piloting guide to assist mounting the retainer 28 to the housing 22. Additionally, the central spindle 74 of the retainer 28 will provide an axis 78 about which the retainer 28 can rotate. After the hooks 30 of the retainer 28 have been inserted within the apertures 62 of the housing 22, the retainer 28 is rotated about the axis 78 defined by the central spindle 74 until the bottom surfaces 72 of the extending lips 70 frictionally engage the top surfaces 58 of the base 56 immediately adjacent to the apertures 62.

If the housing 22 includes a retractable ring 80, then as the hooks 30 of the retainer 28 are inserted within the apertures 62 of the base 56, the circuit board 14, and the retainer 28, will contact the retractable ring 80 before the hooks 30 are fully inserted. As the retainer 28 is firmly inserted, the retractable ring 80 is pushed upward toward the first end 50 of the housing 22. The retractable ring 80 will move to a position where the retractable ring 80 is flush with the bottom surface 60 of the base 56, thereby allowing the circuit board 14 to be moved into contact with the flexible fingers 40, 46.

The foregoing discussion discloses and describes one preferred embodiment of the invention. One skilled in the art will readily recognize from such discussion, and from the accompanying drawings and claims, that changes and modifications can be made to the invention without departing from the true spirit and fair scope of the invention as defined in the following claims. The invention has been described in an illustrative manner, and it is to be understood that the terminology which has been used is intended to be in the nature of words of description rather than of limitation.

What is claimed is:

1. A connector for electrically connecting electrical wires to a circuit board having a hole, comprising:
   at least one terminal adapted to individually connect the circuit board and the electrical wire, said terminal including a first end adapted to engage the electrical wire and a second end, opposite said first end, adapted to engage the circuit board;
   a housing, adapted to be supported solely by the circuit board, defining at least one slot adapted to support said terminal in engagement with the circuit board, and at least one retaining surface; and
   a retainer having at least one hook adapted to extend through the hole in the circuit board and engage said retaining surface of said housing.

2. The connector of claim 1, wherein said terminal includes a first pair of opposing flaps located adjacent said first end and adapted to engage the electrical wire to secure the electrical wire to said terminal, a second pair of opposing flaps located at a distance from said first pair of opposing flaps and adapted to engage the electrical wire to conduct electric current between the electric wire and said terminal, a square tubular section disposed between said second pair of opposing flaps and said second end, a notch within said square tubular section, a first curved flexible finger extending from said second end on a first side of said square tubular section, and a second curved flexible finger extending from said second end on a second side of said square tubular section, said second side being opposite said first side of said square tubular section, said second flexible finger including a dimple within said second flexible finger extending away from said second end.

3. The connector of claim 2, wherein said housing includes a first end and a second end, said slot extending therebetween and including a flexible extension disposed therein to engage said notch on said terminal to secure said terminal within said slot.

4. The connector of claim 3, wherein said second end of said housing includes a base, said base including a top surface, a bottom surface, and at least one aperture extending through said base, said slot including a top opening at said first end of said housing to receive said terminal and a bottom opening at said second end of said housing, said bottom opening of said slot extending through said base.

5. The connector of claim 4, wherein said retainer includes a top surface, said hook extending from said top surface and including an extending lip, said extending lip including a bottom surface adapted for frictional engagement with said retaining surface of said housing, said aperture adapted to receive said hook, said retaining surface being a portion of said top surface of said base immediately adjacent to said opening.

6. The connector of claim 5, wherein said housing further includes a central bore extending upward from said second end of said housing and said retainer includes a central spindle extending upward from said top surface of said retainer, said central bore adapted to receive said central spindle, said retainer being rotatable relative to said housing about an axis defined by said central spindle, thereby allowing said retainer to engage said extending lip and the retaining surface of said housing through relative rotational movement.

7. The connector of claim 6 further including a retractable ring mounted to said housing, said retractable ring extending radially around said housing and extending below said second end of said housing to protect said flexible finger of said terminal, said retractable ring adapted to retract upward to expose said flexible finger when said housing is mounted to said retainer with a circuit board therebetween.

8. The connector of claim 7, wherein said retractable ring includes an inner surface, said inner surface including a dimple extending into said retractable ring and said housing includes an outer surface, said outer surface including a first protrusion extending outward from said outer surface of said housing and being adapted to fit within said dimple of said retractable ring to secure said retractable ring in a first position on said housing, said outer surface further including a second protrusion extending outward from said outer surface of said housing at a distance from said first protrusion, said second protrusion being adapted to fit within said dimple of said retractable ring to secure said retractable ring in a second position on said housing.

9. A terminal adapted to individually connect an electric wire to a circuit board comprising:
   a first end adapted to engage the electrical wire and a second end, opposite said first end, adapted to engage the circuit board;
   a first pair of opposing flaps located adjacent said first end adapted to engage the electrical wire to secure the electrical wire to said terminal;
   a second pair of opposing flaps located at a distance from said first pair of opposing flaps and adapted to engage the electrical wire to conduct electric current between the electric wire and said terminal;
   a square tubular section disposed between said second pair of opposing flaps and said second end, a notch within said square tubular section, a first curved flexible finger extending from said second end on a first side of said square tubular section, and a second curved flexible finger extending from said second end on a second side of said square tubular section, said second side being opposite said first side of said square tubular section, said second flexible finger including a dimple within said second flexible finger extending away from said second end.

10. A method of connecting a wire to a circuit board comprising:
   providing a terminal for connecting the wire to the circuit board, the terminal including a first end, a second end, a first pair of opposing flaps located adjacent the first end, a second pair of opposing flaps located at a distance from the first pair of opposing flaps, a square tubular section disposed between the second pair of opposing flaps and the second end, a notch within the square tubular section, and a first curved flexible finger extending from the second end on a first side of the square tubular section,
   providing a housing for supporting the terminal, the housing includes a first end and a second end and defines at least one slot adapted to support the terminal in a particular position and at least one retaining surface, the slot including a flexible extension disposed therein to engage the notch on the terminal to secure the terminal within the slot, the second end of the housing including a base, the base including a top surface, a bottom surface, and at least one aperture extending through the base, providing a retainer with at least one hook for securing the housing to the circuit board, the retainer including a top surface, the hook extending from the top surface and including an extending lip, the extending lip including a bottom surface adapted for frictional engagement with the retaining surface of the housing, the aperture of the base adapted to receive the hook, the retaining surface being a portion of the top surface of the base immediately adjacent to the opening;

attaching the terminal to the wire by folding the first pair of opposing flaps inward to secure the wire to the terminal and folding the second pair of opposing flaps inward to electrically connecting the wire to the terminal;

inserting the terminal into the housing by inserting the terminal within the slot until the flexible extension engages the notch;

securing the retainer to the housing with the circuit board therebetween by inserting the hook of the retainer through a hole in the circuit board, inserting the hook of the retainer through the opening within the base of the housing with the circuit board between the top surface of the retainer and the bottom surface of the base, rotating the retainer until the bottom surface of the extending lip frictionally engages the top surface of the base immediately adjacent to the opening.

11. The method of claim 10, wherein the housing further includes a central bore extending upward from the second end of the housing and the retainer includes a central spindle extending upward from the top surface of the retainer, the central bore adapted to receive the central spindle, the retainer being rotatable relative to the housing about an axis defined by the central spindle, said method including piloting the central spindle within the central bore prior to inserting the hook of the retainer through the opening within the base and rotating the retainer about the axis defined by the central spindle after the hook of the retainer is inserted within the opening within the base until the bottom surface of the extending lip frictionally engages the top surface of the base immediately adjacent to the opening.

12. The method of claim 11, further providing a retractable ring mounted to the housing, the retractable ring extending radially around the housing and extending below the second end of the housing to protect the flexible finger of the terminal, the retractable ring adapted to retract upward to expose the flexible finger when the housing is mounted to the retainer with a circuit board therebetween, said method including pushing the retainer towards the base of the housing as the hook of the retainer is inserted within the opening within the base of the housing until the circuit board contacts the retractable ring and forcing the retractable ring to move upward as the hook of the retainer is fully inserted within the opening in the base to allow the circuit board to contact the flexible finger of the terminal.

* * * * *

UNITED STATES PATENT AND TRADEMARK OFFICE
CERTIFICATE OF CORRECTION

PATENT NO.     : 6,599,145 B2                                                Page 1 of 1
DATED          : July 29, 2003
INVENTOR(S)    : Harvinder Singh It is certified that error appears in the above-identified patent and that said Letters Patent is hereby corrected as shown below:

Column 6,
Line 2, delete "said/central" and substitute -- said central -- in its place.

Signed and Sealed this

Twenty-eighth Day of October, 2003

JAMES E. ROGAN
*Director of the United States Patent and Trademark Office*